United States Patent
Lopata et al.

(10) Patent No.: US 6,278,393 B1
(45) Date of Patent: Aug. 21, 2001

(54) MULTIPLE OUTPUT DIGITAL-TO-ANALOG CONVERTER

(75) Inventors: Douglas D. Lopata, Boyertown; Malcolm Harold Smith, Macungie, both of PA (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/372,892

(22) Filed: Aug. 12, 1999

(51) Int. Cl.[7] .................................................. H03M 1/66
(52) U.S. Cl. .............................................................. 341/144
(58) Field of Search ................................... 341/144, 145, 341/154

(56) References Cited

U.S. PATENT DOCUMENTS

| | | | |
|---|---|---|---|
| 6,037,889 | * | 3/2000 | Knee ..................................... 341/154 |
| 6,049,300 | * | 4/2000 | Shoval ................................. 341/144 |

* cited by examiner

Primary Examiner—Brian Young
(74) Attorney, Agent, or Firm—David L. Smith

(57) ABSTRACT

There is disclosed an integrated circuit including a digital-to-analog converter in which a resistor string is adapted to be coupled to a reference source. The resistor string includes a plurality of serially coupled impedances defining intermediate taps at the junctions thereof. A first plurality of switches are coupled between a first output node and respective ones of the intermediate taps. A first selection circuit receives a first digitally coded signal and is coupled to each switch in the first plurality of switches. The first selection circuit selectively switches the first plurality of switches to predetermined states depending upon a first digitally coded signal provided thereto, to generate a first analog output. A second plurality of switches are coupled between a second output node and respective ones of the intermediate taps. A second selection circuit coupled to each switch in the second plurality of switches selectively switches the second plurality of switches to predetermined states depending upon a second digitally coded signal provided thereto, to generate a second analog output.

50 Claims, 5 Drawing Sheets

MULTIPLE OUTPUT DIGITAL-TO-ANALOG CONVERTER

TECHNICAL FIELD

This invention relates generally to digital-to-analog converters (DACs), and more particularly to such converters capable of converting more than one digital input to corresponding analog outputs.

BACKGROUND OF THE INVENTION

Digital-to-analog converters are used to convert digitally coded signals to an analog signal, or in conjunction with successive approximation circuitry as part of an analog-to-digital converter. DACs may employ a voltage applied across a resistor string or a current driven resistor string. Switches, such as transistors, couple intermediate taps at the resistor junctions, and sometimes at the resistor-potential junctions, to an output node. The digitally coded signal is decoded to determine which switches to turn on. The magnitude of an analog voltage produced at the output node depends on which switches are turned on. Heretofore, for each digital input and corresponding required analog output, a separate resistor string was required.

What is needed is a digital-to-analog converter that can utilize a single resistor string to provide multiple analog outputs, with each analog output corresponding to a digitally coded signal provided as an input.

SUMMARY OF THE INVENTION

In accordance with an illustrative embodiment of the invention, an integrated circuit includes a digital-to-analog converter in which a resistor string is adapted to be coupled to a reference source. The resistor string includes a plurality of serially coupled impedances defining intermediate taps at the junctions thereof. A first plurality of switches are coupled between a first output node and respective ones of the intermediate taps. A first selection circuit receives a first digitally coded signal and is coupled to each switch in the first plurality of switches. The first selection circuit selectively switches the first plurality of switches to predetermined states depending upon the first digitally coded signal to generate a first analog output. A second plurality of switches are coupled between a second output node and respective ones of the intermediate taps. A second selection circuit receives a second digitally coded signal and is coupled to each switch in the second plurality of switches. The second selection circuit selectively switches the second plurality of switches to predetermined states depending upon the second digitally coded signal to generate a second analog output.

DETAILED DESCRIPTION

Figure 1:
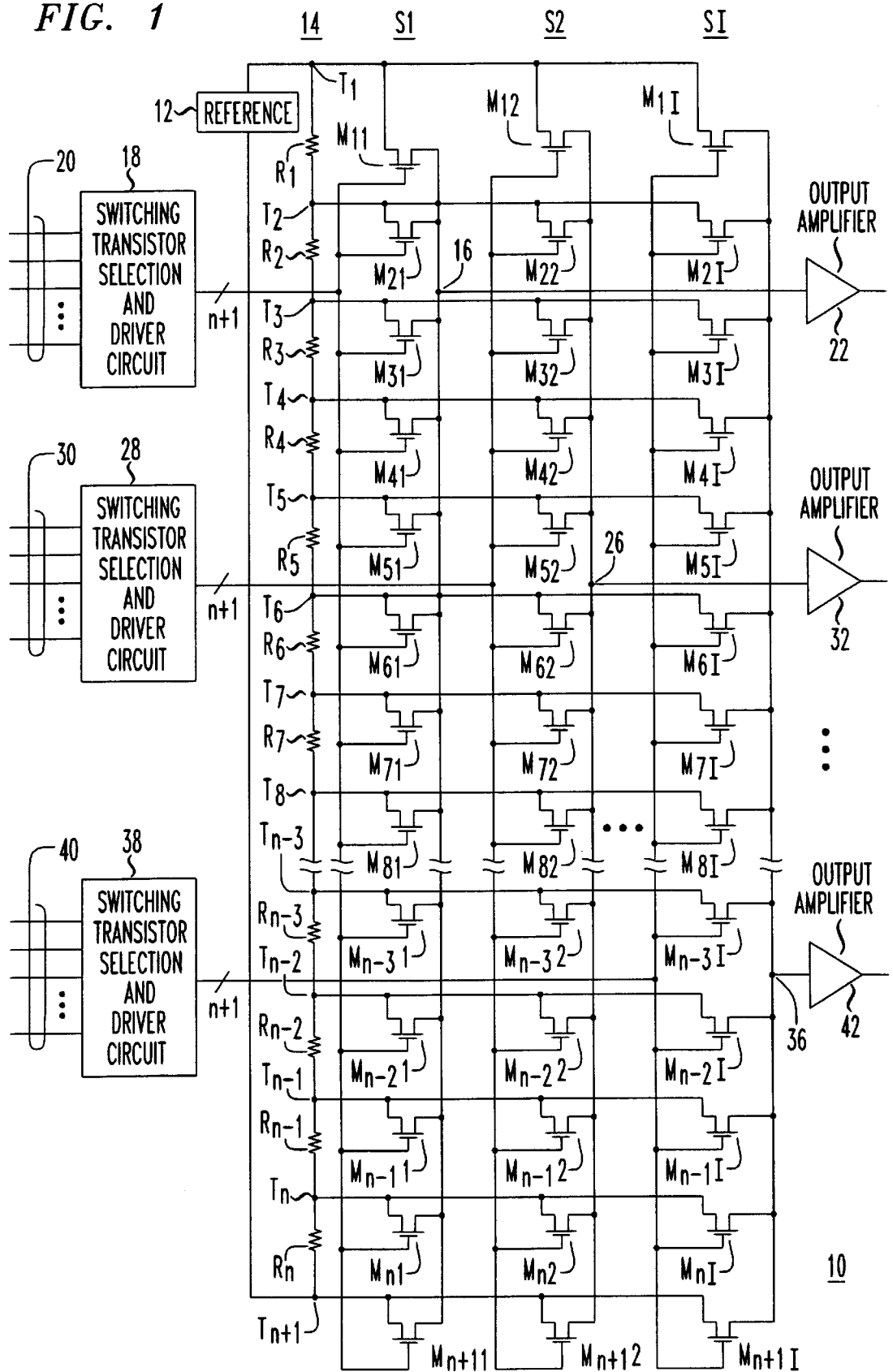
FIG. 1 is a schematic diagram of a single-ended mode digital-to-analog converter in accordance with an illustrative embodiment of the present invention.

A schematic diagram of a single-ended mode digital-to-analog converter (10) in accordance with an illustrative embodiment of the present invention is shown in FIG. 1. DAC 10 is capable of receiving as inputs at least two digitally coded signals and generating as outputs at least two analog signals corresponding to the at least two digitally coded signals.

Resistor string 14 is comprised of a user-determined number, n, of resistors in series, denoted $R_1$ through $R_n$. The resistor string is coupled to a reference source 12 which, when DAC 10 is employed as a digital-to-analog converter, provides either a current or voltage to operate resistor string 14, as is known in the art. The resistance values of the resistors comprising resistor string 14 are application dependent and can be readily selected by one skilled in the art based on a variety of parameters such as the power to be dissipated, the potential across the resistor string, and the number of resistors in the resistor string. The switches, preferably transistors, are shown in the illustrative embodiment as metal oxide semiconductor transistors.

As is known in the digital-to-analog converter art, a digitally encoded signal such as first digitally encoded signal 20, representative of a desired analog signal, is provided to a decode circuit. The decode circuit decodes the digitally encoded signal and the driver circuit turns on the appropriate switch or switches to conduct a voltage at the associated tap(s) to an output node. A single switch may be switched to an on state, or multiple switches may be switched to be in the on state simultaneously. In monotonic input-output characteristics, providing a case output voltage at each output node for increasing digitally encoded inputs is derived from the tap.

DAC 10 is shown having a reference 12, which may be a voltage source or a current source, coupled across resistor string 14. Resistor string 14 is comprised of impedances $R_1$, through $R_n$. The resistor string impedances may be equal resistance resistors. Intermediate taps as $T_2$ to $T_n$ are formed at the junction of impedances in resistor string 14. The junctions $T_1$ and $T_{n+1}$ are between the resistor string 14 and reference 12 also may form taps.

A first set of switches $S_1$, comprising switches $M_{11}$ through $M_{n+1\ 1}$ couple taps to a first output node 16. Switches $M_{1\ 1}$ through $M_{n+1\ 1}$ have drain-to-source paths coupled between first output node 16 and a respective one of the taps, $T_1$ through $T_{n+1}$. The state of switches in the first set of switches is controlled by a first selection circuit. When the first set of switches are transistors, such as the metal oxide semiconductor switches illustrated in FIG. 1, the gate terminal of each switch of the first plurality of switches is coupled to a first switching transistor selection and driver circuit 18. Circuit 18 receives a first digitally coded signal 20 of a predetermined number, m, of bits and determines which switches in the first set of switches to selectively turn to a predetermined state, such as the on-state as illustrated in FIG. 1 to generate at first output node 16 an analog output signal corresponding to the first digitally coded signal 20. Circuit 18 may be an m-to-$2^m$ decoding circuit where m as stated above is the number of bits in first digitally coded signal 20 and $2^m$ is the number of taps that may be switched to contribute to an analog output signal at first output node 16. Output amplifier 22 is a high input impedance amplifier that isolates first output node 16 so as not to load resistor string 14 and drives the analog signal generated at output node 16 to other circuits as needed.

A second set of switches S2, comprising switches $M_{1,2}$ through $M_{n+1,2}$ couple taps to a second output node 26.

Switches $M_{1,2}$ through $M_{n+1,2}$ have drain-to-source paths coupled between second output node 26 and a respective one of the taps $T_1$ through $T_{n+1}$. While the number of switches in the second set of switches S2 is illustrated in FIG. 1 is the same number of switches as are in the first set of switches S1, the invention is not limited thereto. The number of switches in the second set of switches need not be the same number of switches as are in the first set of switches. For example, there could be fewer switches in the second set of switches than the first set of switches, thereby implementing a lower resolution DAC function.

The state of the switches in the second set of switches S2 is controlled by a second selection circuit. When the second set of switches are transistors, such as the MOS switches illustrated, the gate of each switch of the second plurality of switches is coupled to a second switching transistor selection driver circuit 28. Circuit 28 receives a second digitally coded signal 30 of a predetermined number of bits and determines which switches in the second set of switches to selectively turn to a predetermined state. The predetermined state may, for example, be as illustrated as in FIG. 1 the on-state to generate at second output node 26 an analog output signal corresponding to the second digitally coded signal 30. While the second digitally coded signal 30 is illustrated as having the same number of bits as the first digitally coded signal 20, the invention is not limited thereto. Like circuit 18, circuit 28 could be an m-to $2^m$ decoding circuit where m would be the number of bits in second digitally coded signal 30 and $2^m$ is the number of taps that may be switched to contribute to an analog output signal at second output node 26. Output amplifier 32 is a high input impedance amplifier that isolates second output node 26 so as not to load resistor string 14 and drives the analog signal generated at second output node 26 to other circuits, as needed.

While the taps coupled to second output node 26 through the second set of switches S2 may be the same taps coupled to the first output node 16 through the first set of switches, the invention is not limited thereto. While typically all of the taps would be available to be coupled to each output node, the minimum commonality would require a single tap adapted to be coupled through the first set of switches to first output node 16 and the same tap adapted to be coupled through the second set of switches to second output node 26.

In accordance with the present invention, at least two analog outputs corresponding to two digital inputs can be generated employing a single resistor string. FIG. 1 also shows that additional sets of switches may be coupled between taps of resistor string 14 and various output nodes. An $I^{th}$ set of switches SI, comprising switches $M_{1,I}$ through $M_{n+1,I}$, couple taps of resistor string 14 to an $I^{th}$ output node 36. Switches $M_{1,I}$ through $M_{n+1,I}$, like the first and second sets of switches, have drain-to-source paths coupled between an $I^{th}$ output node 36 and a respective one of the taps T1 through $T_{n+1}$. The state of the switches in the $I^{th}$ set of switches is controlled by an $I^{th}$ selection circuit. When the $I^{th}$ set of the switches are transistors, such as the MOS switches illustrated in FIG. 1, the gate of each switch of the $I^{th}$ plurality of switches is coupled to an $I^{th}$ switching transistor selection and driver circuit 38. Circuit 38 receives an $I^{th}$ digitally coded signal 40 of a predetermined number of bits and determines which switches in the $I^{th}$ set of switches to selectively turn to a predetermined state. In FIG. 1 the predetermined state is illustrated as the on state, to generate at the $I^{th}$ output node 36 an analog output signal corresponding to the $I^{th}$ digitally coded signal 40. Circuit 38, like circuits 18 and 28, could be an m-to-$2^m$ decoding circuit, where m is the number of bits in the $I^{th}$ digitally coded signal 40 and $2^m$ is the number of taps that may be switched to contribute to an analog output signal at the $I^{th}$ output node 36. Output amplifier 42 is a high input impedance amplifier that isolates the $I^{th}$ output node 36 so as not to load resistor string 14 and drives the analog signal generated at the $I^{th}$ output node 36 to other circuits as needed.

The switching transistors in each of the first, second and $I^{th}$ sets of switches are typically identical and have an impedance in the conductive state that is very large compared in the resistance of resistors in resistor string 14. Each output amplifier is a high input impedance amplifier that isolates the respective output node so as not to alter the voltage developed at taps on resistor string 14 and drives the analog signal generated at the respective output node to other circuits, as needed. Since each output amplifier is a high impedance amplifier, the resistor string is not substantially loaded in driving output amplifiers so the staircase output monotonic voltage is not disrupted.

Figure 2:
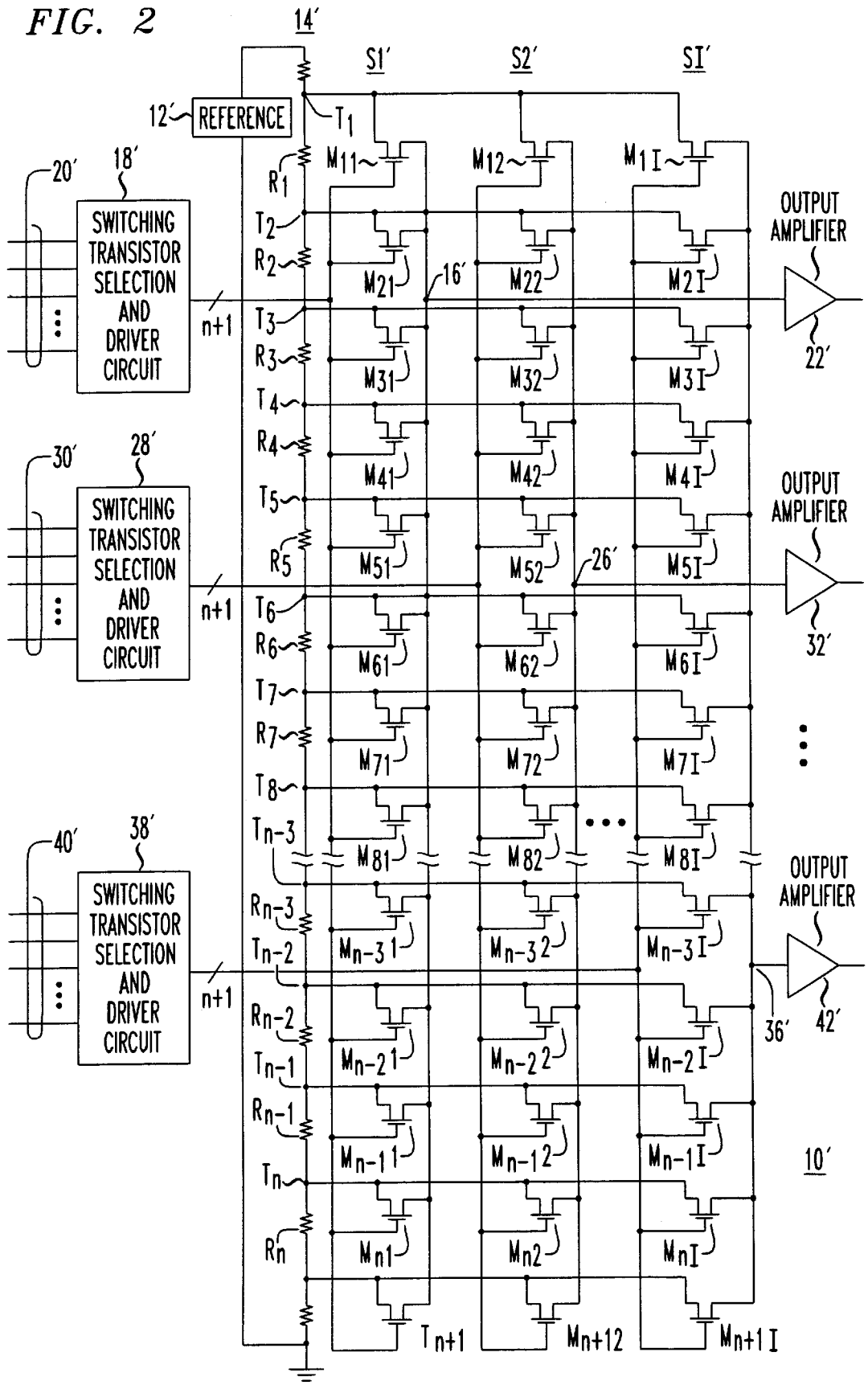
FIG. 2 is a schematic diagram of a single-ended mode digital-to-analog converter similar to the converter of FIG. 1 in which an additional resistor is illustrated between the endmost intermediate taps and the reference source.

FIG. 2 is a schematic diagram of a single-ended mode digital-to-analog converter 10' similar to DAC 10 of FIG. 1. Similar elements have the same reference numeral, followed by a prime. The differences between DAC 10 and DAC 10' are that an additional resistance is interposed between each end of resistor string 14 and reference 12 of DAC 10 to form resistor string 14' in DAC 10'. When each resistor in resistor string 14 is of the same resistance, the additional resistances interposed between resistor string 14 and reference 12 are typically one half of the resistance of the resistor string resistors.

Figure 3:
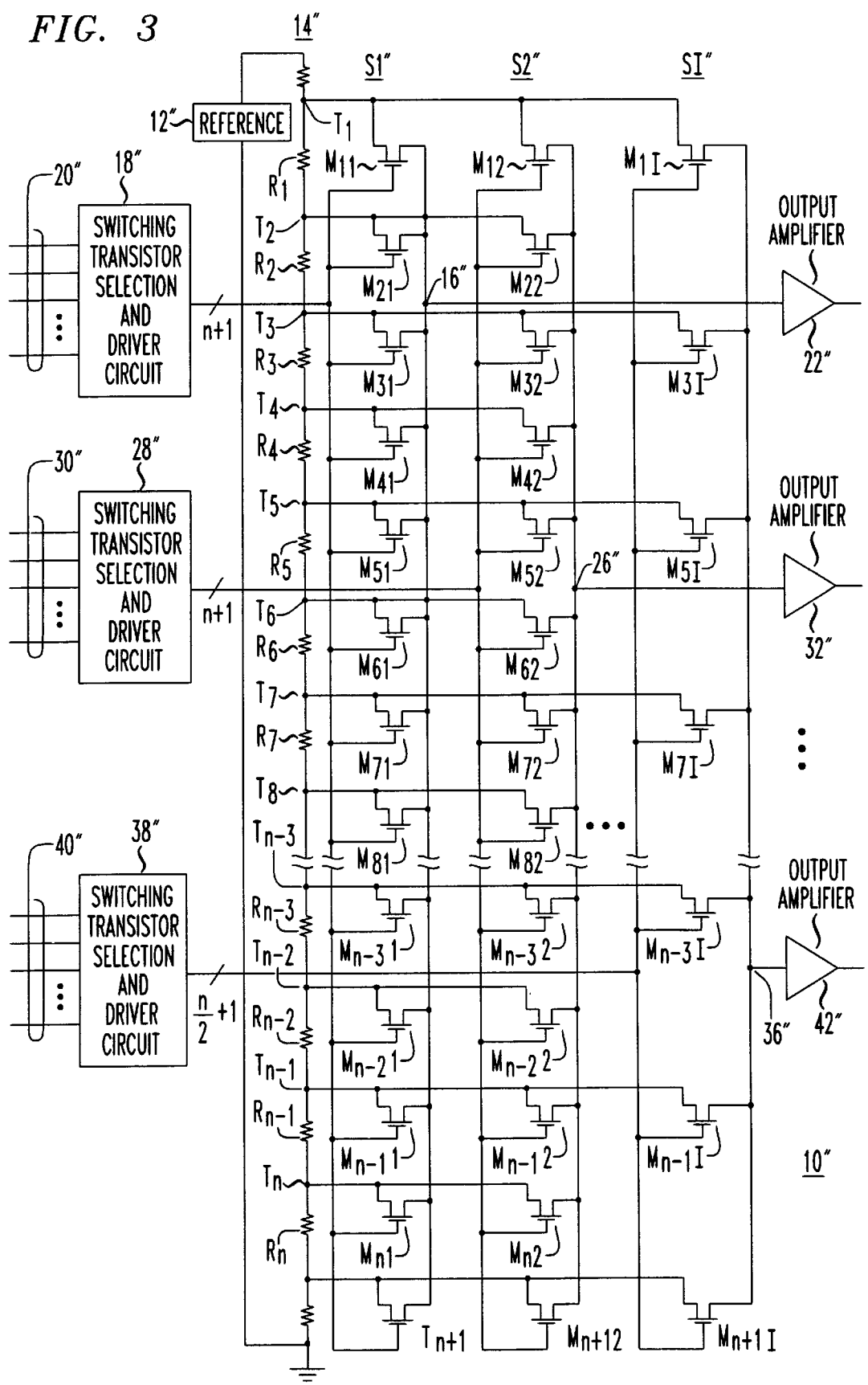
FIG. 3 is a schematic diagram of a single-ended mode digital-to-analog converter illustrating a different resolution than the digital-to-analog converter illustrated in FIG. 2.

FIG. 3 is a schematic diagram of a single-ended mode digital-to-analog converter 10" wherein the resolution of all analog outputs is not identical. Reference numerals for elements similar to elements in FIGS. 1 and 2 are followed by a double prime. In the illustrative embodiment of FIG. 3, conversion of $I^{th}$ digitally coded signal 40" into an analog output signal at $I^{th}$ node 36" is accomplished with a different resolution than conversion of first digitally coded signal 20" into an analog output signal at first node 16" or second digitally coded signal 30" into an analog output signal at second node 26". The different resolution may be achieved for example by coupling less than all of the taps in resistor string 14" to the $I^{th}$ output node 36". In the illustrated example, half of the taps are coupled to $I^{th}$ output node 36" in that every other tap is coupled through a switch in the $I^{th}$ set of switches to the $I^{th}$ output node, node 36". Elimination of the switching structures would reduce area requirements to fabricate DAC 10".

While an example of one resolution variation has been illustrated in which the resolution of a single analog output is reduced by half over the same range by elimination of some switches in the $I^{th}$ set of switches, the invention is not so limited. Each of the analog outputs may have a different resolution. The range of each analog output may be different; that is the range need not be coextensive. See the discussion below on subranging with respect to FIG. 4. The resolution variations are not limited to half. The resolution variation is dependent on which taps are adapted to be coupled to a respective output node. In addition, elimination of switches is not the only way to achieve resolution variations. The same resolution variation as achieved in FIG. 3 by elimination of some of the switches in the $I^{th}$ switch set can be achieved with the switches present, such as in FIG. 2, through selective control of the corresponding decode circuit. Circuit 38' may control which switches, even though present, are available to be switched to contribute to an analog output signal at the $I^{th}$ output node 36.

Figure 4:
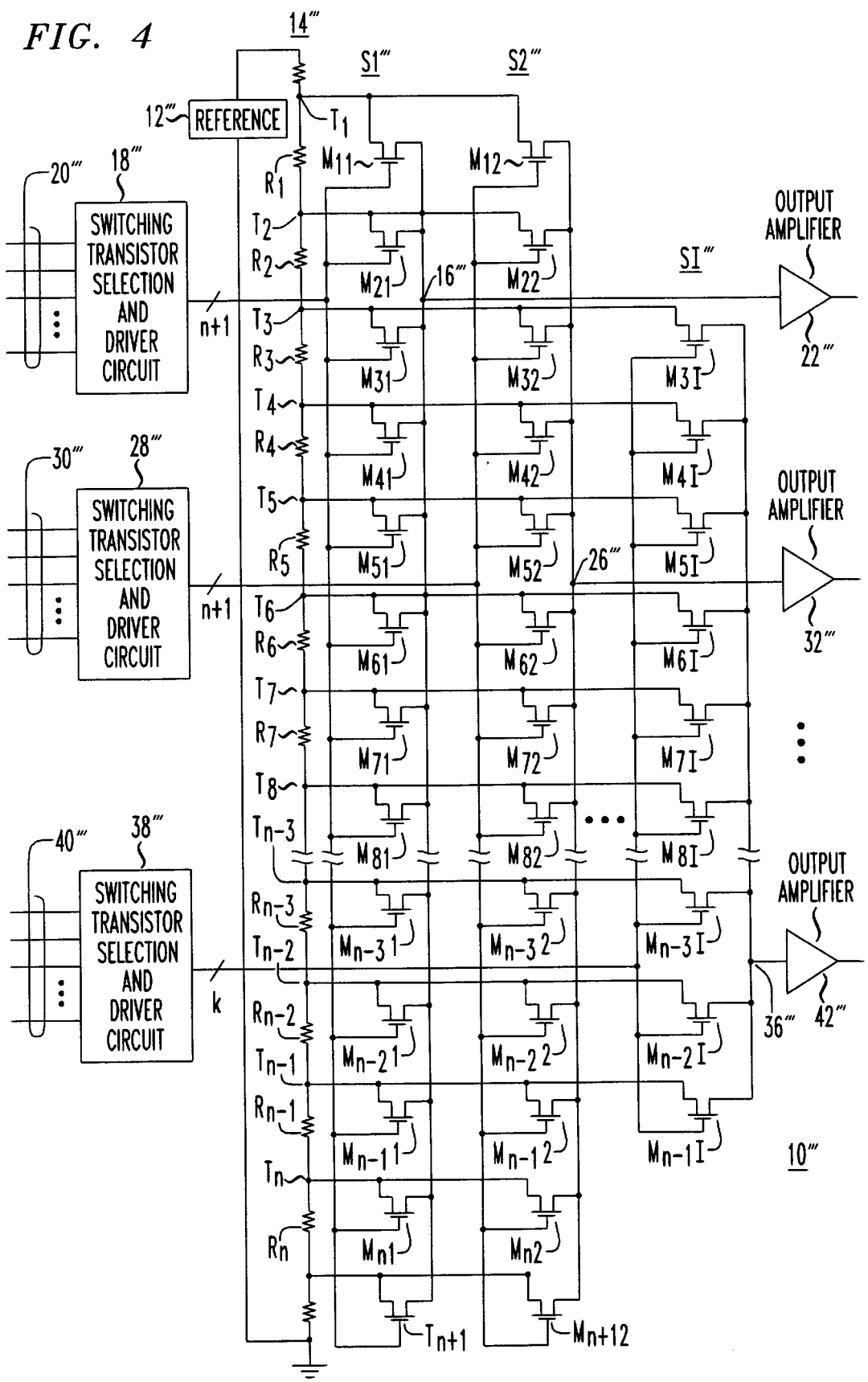
FIG. 4 is a schematic diagram of a single-ended mode digital-to-analog converter illustrating subranging.

FIG. 4 is a schematic diagram of a single-ended mode digital-to-analog converter illustrating subranging. One or more analog output signals may span at least a portion of the range represented by the resistor string 14''' with a first resolution, while another analog output signal spans at least a portion of the range represented by resistor string 14''' with a second, different, resolution. The portion of the range represented by resistor string 14''' having the first resolution and the portion of the range having the second resolution may overlap, although the invention is not limited thereto.

Similar to providing the capability to vary resolution, subranging can be achieved through elimination of switches or through selective control of switches by the corresponding decode circuit. FIG. 4 illustrates a combination of these two techniques. For example, a full range analog output signal may be generated at first output node 16''' from a first digitally encoded signal 20'''. The resolution of the analog output signal is achieved by selective switching of switches controlled by circuit 18''', which may employ every other switch in switch set S1''', and therefore every other tap contributes to the analog signal generated at first output node 16'''. Output amplifier 22''' may provide the analog output signal produced at first output node 16''' to a device requiring that resolution.

The same digitally encoded signal may be presented as $I^{th}$ digitally encoded signal 40'''. An analog signal generated at $I^{th}$ output node 36''' corresponding to digitally encoded signal 40''' having a finer resolution. The resolution of the analog output signal produced is determined by selective switching of switches controlled by circuit 38''' by way of k control lines. Circuit 38''' may employ every switch in the $I^{th}$ switch set. When the range of digitally encoded signal 40''' is known a priori, less than all of the switches in the $I^{th}$ switch set may be present, or if present less than all of the switches may be available to be switched. In this example, since every tap is used to contribute to $I^{th}$ output node 36''' the resolution of the analog output signal generated at Ith output node 36''' is of finer resolution than the analog output signal generated at first output node 16'''. Output amplifier 42''' may provide the analog output signal produced at the $I^{th}$ output node 36''' to a device requiring a finer resolution than the analog output signal produced at first output node 16'''.

While an example of subranging has been illustrated, the invention is not limited thereto. For example the subranging range could be from the lower reference source to the midpoint of the resistor string, from the midpoint of the resistor string to the upper reference source, or other ranges. In addition, the relationship between the resolutions achieved can differ from the example, and the impedances in the resistor string may have different magnitudes in the subranging range than in the nonsubranging range.

Figure 5:
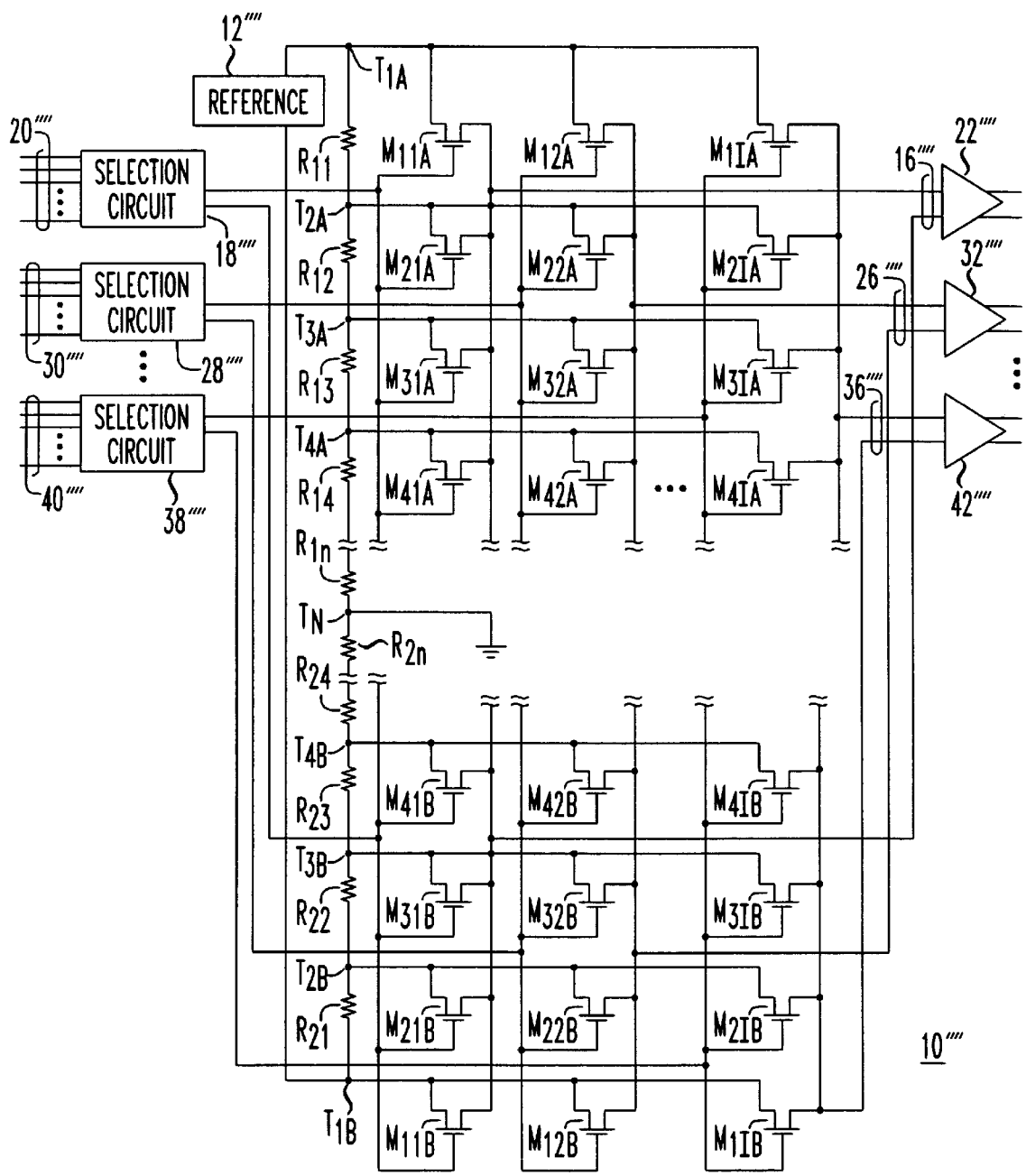
FIG. 5 is a schematic diagram of a differential mode digital-to-analog converter providing at least two differential analog outputs corresponding to two digitally encoded input signals.

FIG. 5 is a schematic diagram of a differential mode digital-to-analog converter providing at least two differential analog outputs in accordance with the invention. Reference numerals for elements similar to elements in earlier Figures are followed by a quadruple prime. In the illustrative embodiment of a differential mode DAC 10'''', the tap, $T_N$ is coupled to a reference potential, such as ground. Absent noise and with a constant voltage or current provided by reference 12'''', taps $T_{1A}, T_{2A}, T_{3A}, T_{4A}$ and any other taps in the sequence to tap $T_N$, operate at, for example, a positive voltage whereas taps $T_{1B}, T_{2B}, T_{3B}, T_{4B}$ and any other taps in this series to tap $T_N$, operate at a negative voltage. To provide a differential analog output voltage at one of the output nodes 16'''', 26'''' or 36'''', switching transistors of switches in a set of switches are turned on symmetrically about tap $T_N$. Whereas with DACs 10, 10', 10'' and 10''', a single switching transistor in a set of switches may be turned on to provide an analog output voltage at one of the output nodes, with differential node DAC 10'''', transistors in a set of switches are turned on in pairs symmetrically about the center tap $T_N$ in resistor string 14''''. For example, if transistor $M_{2\ 1,A}$ is switched to the on state, transistors $M_{2\ 1,B}$ which is symmetrically opposite from tap $T_N$ in the first set of switches, is also turned on. In another example, if transistor $M_{3\ 2,A}$ is switched to the on state, transistor $M_{3\ 2,B}$ is also switched to the on state to provide a differential analog output at output node 26''''. The voltages provides from the taps symmetrically about the center tap of resistor string 14'''' provides positive and negative inputs to differential amplifiers 22'''' at output node 16'''', output amplifier 32'''' at output node 26'''' and output amplifier 42'''' at output node 36''''. Output amplifiers 22'''', 32'''' and 42'''' are high input impedance amplifiers that do not load resistor string 14'''' an drive the differential analog signal generated at the respective output node to other circuits, as needed. Outputs based on different resolutions and subranging could also be achieved in a differential mode digital-to-analog converter.

The invention is particularly useful in communication systems and equipment employing integrated circuits in digital-to-analog and analog-to-digital converter applications. While the invention has been illustrated as having switches that are metal oxide semiconductor transistors, the invention is not limited thereto. Other types of switches may be employed, for example but not limited to other switching devices such as bipolar transistors. Although the invention has been illustrated as switching transistors to be in the on-state to generate an analog output voltage, one skilled in the art could design a dual circuit in which transistors whose corresponding tap contribution is not wanted to contribute to an analog output voltage could be switched to the off-state. Furthermore, the teachings of U.S. Pat. No. 5,604,501 entitled Digital-to-Analog Converter with Reduced Number of Resistors and Method of Using, the disclosure of which is hereby incorporated by reference, may be incorporated into the invention disclosed herein.

What is claimed is:

1. A digital-to-analog converter for providing at least two analog outputs, comprising:

a resistor string adapted to be coupled to a reference source, the resistor string comprising a plurality of serially coupled impedances, the resistor string having taps at junctions of the impedances in the resistor string;

a first plurality of switches, each of the first plurality of switches coupled between a first output node and a respective one of the taps;

a first selection circuit coupled to switches in the first plurality of switches for selectively switching switches in the first plurality of switches to a predetermined state to generate a first analog output;

a second plurality of switches, each of the second plurality of switches coupled between a second output node and a respective one of the taps; and a second selection circuit coupled to switches in the second plurality of switches for selectively switching switches in the second plurality of switches to a predetermined state to generate a second analog output.

2. A digital-to-analog converter as recited in claim 1, wherein at least one of the analog outputs is a single-ended output.

3. A digital-to-analog converter as recited in claim 1, wherein both of the at least two analog outputs are single ended.

4. A digital-to-analog converter as recited in claim 1, wherein at least one of the analog outputs is a differential output.

5. A digital-to-analog converter as recited in claim 1, wherein both of the at least two analog outputs are differential outputs.

6. A digital-to-analog converter as recited in claim 1, wherein the switches are transistors.

7. A digital-to-analog converter as recited in claim 6, wherein the predetermined state of the transistors is the on-state.

8. A digital-to-analog converter as recited in claim 1, wherein resolution of one of the at least two analog outputs is different from resolution of the other of the at least two analog outputs.

9. A digital-to-analog converter as recited in claim 1, wherein resolution of one of the at least two analog outputs extends over a lesser range than the other of the at least two analog outputs, the analog output extending over the lesser range having a finer resolution.

10. A digital-to-analog converter as recited in claim 1, wherein the reference source is a current source.

11. A digital-to-analog converter as recited in claim 1, wherein the reference source is a voltage source.

12. A digital-to-analog converter as recited in claim 1, wherein the impedances are of equal impedance.

13. A digital-to-analog converter as recited in claim 1, further comprising:
   a third plurality of switches, each of the third plurality of switches coupled between a third output node and a respective one of the intermediate taps; and
   a third selection circuit coupled to switches in the third plurality of switches for selectively switching switches in the third plurality of switches to generate a third analog output, whereby at least three analog outputs are provided.

14. A digital-to-analog converter as recited in claim 1, wherein each of the first and second selection circuits receives a digitally coded signal of a predetermined number of bits, the predetermined number of bits in the digitally coded signal received by the first selection circuit having the same number of bits as the digitally coded signal received by the second selection circuit.

15. A digital-to-analog converter as recited in claim 1, wherein the taps to which the switches in the second plurality of switches are coupled coextensive with the taps to which the switches in the first plurality of switches are coupled.

16. An integrated circuit including a digital-to-analog converter for providing at least two analog outputs, comprising:
   a resistor string adapted to be coupled to a reference source, the resistor string comprising a plurality of serially coupled impedances, the resistor string having taps at junctions of the impedances in the resistor string;
   a first plurality of switches, each of the first plurality of switches coupled between a first output node and a respective one of the taps;
   a first selection circuit coupled to switches in the first plurality of switches for selectively switching switches in the first plurality of switches to a predetermined state to generate a first analog output;
   a second plurality of switches, each of the second plurality of switches coupled between a second output node and a respective one of the taps; and
   a second selection circuit coupled to switches in the second plurality of switches for selectively switching switches in the second plurality of switches to a predetermined state to generate a second analog output.

17. An integrated circuit as recited in claim 16, wherein at least one of the analog outputs is a single-ended output.

18. An integrated circuit as recited in claim 16, wherein both of the at least two analog outputs are single ended.

19. An integrated circuit as recited in claim 16, wherein at least one of the analog outputs is a differential output.

20. An integrated circuit as recited in claim 16, wherein both of the at least two analog outputs are differential outputs.

21. An integrated circuit as recited in claim 16, wherein the switches are transistors.

22. An integrated circuit as recited in claim 21, wherein the predetermined state of the transistors is the on-state.

23. An integrated circuit as recited in claim 16, wherein resolution of one of the at least two analog outputs is different from resolution of the other of the at least two analog outputs.

24. An integrated circuit as recited in claim 16, wherein resolution of one of the at least two analog outputs extends over a lesser range than the other of the at least two analog outputs, the analog output extending over the lesser range having a finer resolution.

25. An integrated circuit as recited in claim 16, wherein the reference source is a current source.

26. An integrated circuit as recited in claim 16, wherein the reference source is a voltage source.

27. An integrated circuit as recited in claim 16, wherein the impedances are resistors.

28. An integrated circuit as recited in claim 27, wherein the resistors are of equal resistance.

29. An integrated circuit as recited in claim 16, further comprising:
   a third plurality of switches, each of the third plurality of switches coupled between a third output node and a respective one of the intermediate taps; and
   a third selection circuit coupled to switches in the third plurality of switches for selectively switching switches in the third plurality of switches to generate a third analog output.

30. An integrated circuit as recited in claim 16, wherein each of the first and second selection circuits receives a digitally coded signal of a predetermined number of bits, the predetermined number of bits in the digitally coded signal received by the first selection circuit having the same number of bits as the digitally coded signal received by the second selection circuit.

31. An integrated circuit as recited in claim 16, wherein the taps to which the switches in the second plurality of switches are coupled are coextensive with the taps to which the switches in the first plurality of switches are coupled.

32. An integrated circuit including a digital-to-analog converter for providing at least two analog outputs, comprising:
   a resistor string adapted to be coupled to a reference source, the resistor string comprising a plurality of serially coupled impedances defining taps;
   a first circuit for receiving a first digital input and generating a corresponding first analog output; and
   a second circuit for receiving a second digital input and generating a corresponding second analog output.

33. An integrated circuit as recited in claim 32, wherein at least one of the analog outputs is a single-ended output.

34. An integrated circuit as recited in claim 32, wherein both of the at least two analog outputs are single ended.

35. An integrated circuit as recited in claim 32, wherein at least one of the analog outputs is a differential output.

36. An integrated circuit as recited in claim 32, wherein both of the at least two analog outputs are differential outputs.

37. An integrated circuit as recited in claim 32, wherein the switches are transistors.

38. An integrated circuit as recited in claim 37, wherein the predetermined state of the transistors is the on-state.

39. An integrated circuit as recited in claim 32, wherein resolution of one of the at least two analog outputs is different from resolution of the other of the at least two analog outputs.

40. An integrated circuit as recited in claim 32, wherein resolution of one of the at least two analog outputs extends over a lesser range than the other of the at least two analog outputs, the analog output extending over the lesser range having a finer resolution.

41. An integrated circuit as recited in claim 32, wherein the reference source is a current source.

42. An integrated circuit as recited in claim 32, wherein the reference source is a voltage source.

43. An integrated circuit as recited in claim 32, wherein the impedances are resistors.

44. An integrated circuit as recited in claim 43, wherein the resistors are of equal resistance.

45. An integrated circuit as recited in claim 29, further comprising:
   a third plurality of switches, each of the third plurality of switches coupled between a third output node and a respective one of the intermediate taps; and
   a third selection circuit coupled to switches in the third plurality of switches for selectively switching switches in the third plurality of switches to generate a third analog output.

46. An integrated circuit as recited in claim 30, wherein each of the first and second selection circuits receives a digitally coded signal of a predetermined number of bits, the predetermined number of bits in the digitally coded signal received by the first selection circuit having the same number of bits as the digitally coded signal received by the second selection circuit.

47. An integrated circuit as recited in claim 31, wherein the taps to which the switches in the second plurality of switches are coupled are coextensive with the taps to which the switches in the first plurality of switches are coupled.

48. A method of generating at least two analog outputs from a digital-to-analog converter, comprising the steps of:
   coupling an impedance string having a plurality of serially coupled impedances to a reference source, the impedance string defining taps at junctions of the impedances;
   coupling each switch of a first plurality of switches between a first output node and a respective one of the taps;
   selectively switching switches in the first plurality of switches to a predetermined state to generate a first analog output;
   coupling each switch of a second plurality of switches between a second output node and a respective one of the taps; and selectively switching switches in the second plurality of switches to a predetermined state to generate a second analog output.

49. A method of generating at least two analog outputs as recited in claim 48, wherein selectively switching switches in the first and second plurality of switches to a predetermined state comprises switching said switches to an on state.

50. A method of generating at least two analog outputs as recited in claim 48, further comprising the steps of:
   coupling each switch of a third plurality of switches between a third output node and a respective one of the taps; and
   selectively switching switches in the third plurality of switches to a predetermined state to generate a third analog output.

* * * * *